(12) United States Patent
Brancken et al.

(10) Patent No.: US 9,161,414 B2
(45) Date of Patent: Oct. 13, 2015

(54) METHOD OF DETECTING A LED FAILURE, A CONTROLLER THEREFOR, A LIGHTING UNIT AND LIGHTING SYSTEM

(71) Applicant: NXP B. V., Eindhoven (NL)

(72) Inventors: Pascal Brancken, Opwijk (BE); Viet Hoang Nguyen, Leuven (BE); Radu Surdeanu, Roosbeek (BE)

(73) Assignee: NXP, B.V., Eindhoven (NL)

( * ) Notice: Subject to any disclaimer, the term of this patent is extended or adjusted under 35 U.S.C. 154(b) by 0 days.

(21) Appl. No.: 14/026,156

(22) Filed: Sep. 13, 2013

(65) Prior Publication Data

US 2014/0097849 A1    Apr. 10, 2014

(30) Foreign Application Priority Data

Oct. 4, 2012    (EP) .................................... 12187154

(51) Int. Cl.
*G01R 31/00*    (2006.01)
*G01R 31/08*    (2006.01)
*H05B 33/08*    (2006.01)
*G01R 31/26*    (2014.01)

(52) U.S. Cl.
CPC ........ *H05B 33/0884* (2013.01); *G01R 31/2635* (2013.01); *H05B 33/089* (2013.01); *H05B 33/0893* (2013.01)

(58) Field of Classification Search
CPC ........... H05B 33/0893; H05B 33/0884; G01R 31/2635

USPC ................................................... 324/414, 522
See application file for complete search history.

(56) References Cited

U.S. PATENT DOCUMENTS

| | | | |
|---|---|---|---|
| 2011/0133769 A1* | 6/2011 | Chen et al. | 324/762.07 |
| 2012/0001552 A1 | 1/2012 | Tsai et al. | |
| 2012/0098430 A1 | 4/2012 | Inque et al. | |
| 2012/0139544 A1 | 6/2012 | Zimmermann et al. | |
| 2012/0200296 A1* | 8/2012 | Avenel | 324/414 |

FOREIGN PATENT DOCUMENTS

| | | |
|---|---|---|
| DE | 10 2009 017989 A1 | 10/2010 |
| TW | 201204179 A1 | 1/2012 |
| WO | 2009/095853 A2 | 8/2009 |

OTHER PUBLICATIONS

Extended European Search Report for application No. 12187154.5 (Mar. 14, 2013).
Office Action from counterpart application CN201310451250.2 (Mar. 23, 2015).

* cited by examiner

*Primary Examiner* — Amy He

(57) ABSTRACT

Disclosed herein is a method of detecting an LED failure in a series-connected string of LEDs using a parameter indicative of a voltage difference between a voltage across the string at a predetermined relatively high current and a voltage across the string at a predetermined relatively low current. The disclosure extends to controllers configured to detect an LED failure in a string of LEDs, to LED lighting units comprising such controllers, and to lighting subsystems, for instance automobile lighting subsystems.

13 Claims, 6 Drawing Sheets

METHOD OF DETECTING A LED FAILURE, A CONTROLLER THEREFOR, A LIGHTING UNIT AND LIGHTING SYSTEM

CROSS-REFERENCE TO RELATED APPLICATIONS

This application claims the priority under 35 U.S.C. §119 of European patent application no. 12187154.5, filed on Oct. 4, 2012, the contents of which are incorporated by reference herein.

FIELD OF THE INVENTION

This invention relates to methods of detecting an LED failure in a string of LEDs. It further relates to controllers configured to detect an LED failure in a string of LEDs, to LED lighting units comprising such controllers, and to lighting subsystems, for instance automobile lighting subsystems, which include one or more such LED lighting units.

BACKGROUND OF THE INVENTION

LEDs are used today as light sources for high performance lighting fixtures. There are known advantages of LEDs as a light source, such as high efficacy in terms of lumens per watt, small form factor and durability. Moreover, LED lifetimes may be significantly longer than incandescent light bulbs. For instance, it is reported that the average life time of a LED is approximately 50000 hours instead of 2000 hours of an incandescent light bulb. As a result, LEDs are becoming a preferred light source in difficult-to-replace lighting fixtures—such as street lights and traffic signal lights, and in fixtures that require higher reliability—such as automotive lights, for safety reasons.

Nonetheless, the spread of lifetimes is not negligible, and use LED strings, since a string is only as good as its worst LED. In many applications this can lead to issues or challenges in applications which, it is therefore desirable or necessary to detect when a single LED in the string fails, in order that the system can react in a suitable way. In applications where a string of different colour LEDs is used to provide a white light source—which may even be tuneable or dimmable—a failure of an LED would mean a shift in the total colour of the system; in other applications, in which each LED in a string of LEDs is separately visible—such as daytime running lights (DRL) in the automobile industry—there may be an aesthetic impact of the failure of a single LED.

Failure of an LED in a string of LEDs can generally occur in one of two ways: firstly, the LED may fail open-circuit in which case the entire string becomes open circuit, which is generally easy to detect; alternatively, the LED may fail in a closed-circuit mode. Such a failure may not be so easy to detect.

LED strings are commonly operated in either a constant current mode, or in a pulse width modulated (PWM) mode in which pulsed current is supplied through the string, with the current being switched off between pulses and there being a predetermined mark-space ratio of the pulses. The PWM may typically be operated to provide either a constant average current or a constant on-current. During the on-state, a short-circuit failure of an LED may be detected by means of a reduction in the voltage across the string, with the reduction corresponding to the forward voltage (in the on-state) of the LED just prior to its failure. However, the forward voltage across an operating LED is dependent not only on the current through it, but also on its junction temperature. So, for instance, it may not be possible to distinguish between a fully operational string of 20 LEDs each operating at a first junction temperature, and a string of 19 LEDs (together with one LED in which has failed in a short-circuit mode), at a second temperature 30° cooler than the first temperature. Further, if the failure occurs during a start-up phase, there may not be a well-determined or stable forward voltage across the string, just prior to the failure, so it may not be possible to detect a change in the voltage, and an LED failure may thus go undetected.

SUMMARY OF THE INVENTION

It is an object of the present invention to provide an alternative method and apparatus for detecting an LED failure in a string of LEDs.

According to a first aspect there is provided a method of detecting an LED failure in a series-connected string of LEDs using a parameter indicative of a voltage difference between a voltage across the string at a predetermined relatively high current and a voltage across the string at a predetermined relatively low current, wherein at both the relatively low current and the relatively high current levels the current through an un-failed LED is dominated by minority-carrier diffusion current, the method comprising: determining a calibration value of the parameter during a first start-up phase; storing the calibration value in a store; determining a subsequent value of the parameter during a subsequent measurement phase; and, in response to a difference between the calibration value and the subsequent value exceeding a threshold, determining that an LED failure has occurred.

The phrase "dominated by" when used in conjunction with an entity, shall be understood to have its natural meaning, and for the avoidance it doubt it is confirmed that the entity is, qualitatively or quantitatively, the most significant among the range of possible entities. It will be well-understood that the current through an LED, at any specific voltage, is influenced by minority carrier diffusion current, recombination current, shunt resistance and series resistance. Thus the phrase "dominated by minority-carrier diffusion current" shall be understood to mean that the current contribution provided by the diffusion of minority carriers is greater than that from recombination current, or from the effects of shunt resistance, or series resistance.

In embodiments, the relatively high current is such that the effect of a series resistance of an un-failed LED operating at the relatively high current is to reduce the current by no more than 10%, 5%, or even 1%, compared with an idealised un-failed LED having zero series resistance. Thus series resistance effects, which can cause a rounding-off of the I-V current-voltage response characteristic of an LED, are negligible, in that they do not have any significant effect on the current through the LED.

In embodiments, each of the relatively high current and the relatively low current is in the range of 1 μA to 100 mA, and the relatively high current is at least 5 times, 100 or even 1,000 times greater than the relatively low current. In such embodiments, the relatively high current is higher than the relatively low current by a factor which is sufficiently large to result in an accurate measurement of the voltage difference, or equivalently a good indication of the ideality factor of the LED.

In embodiments, the calibration value is determined when the string of LEDs is first operated in an application. Thus the calibration factor may be determined when the string of LEDs is first operated with the controller. In a non-limiting example application of automobile lighting, for instance, this may be during initial assembly of the automobile, or when the string of LEDs is replace following either an LED failure, or accidental mechanical damage, for instance due to a road traffic accident.

In embodiments, during normal operation, the string of LEDs is operated in a pulsed mode between an operating current, which is higher than the relatively high current, and a quiescent current, which is either the relatively low current or zero current. Thus the LED string may normally be operated in a high current mode. During operation at such a high current, it may not be possible to accurate determine an ideality factor of the LED string, for example due to the effects of series resitance on the LED current. Also, by operating the string of LEDs in a pulsed mode between an operating current, and a quiescent current, which is a relatively low—but non-zero—current at which the diffusion current still dominates, it may be possible to determine the junction temperature on the LED without the need for a separate temperature sensor, as is disclosed in Applicant's previously published international patent application, publication number WO2009/095853-A2.

Embodiments further comprise, in response to determining that an LED failure has occurred, adjusting at least one of the operating current and a mark-space ratio of the pulsed mode to compensate an optical output from the string of LEDs for the LED failure.

According to another aspect, there is provided a controller configured to detect an LED failure in a series-connected string of LEDs using a parameter indicative of a voltage difference between a voltage across the string at a predetermined relatively high current and a voltage across the string at a predetermined relatively low current, wherein at both the relatively low current and the relatively high current levels the current through an un-failed LED is dominated by minority-carrier diffusion current the controller comprising: a measuring unit configured to determine a calibration value of the parameter during a first start-up phase, and to determine a subsequent value of the parameter during a subsequent measurement phase; a store configured to store the calibration value; and a comparison unit configured to indicate an LED failure in response to a difference between the calibration value and the subsequent value exceeding a predetermined threshold.

In embodiments the high current is such that the effect of a series resistance of an un-failed LED operating at the high current is to reduce the current by no more than 10% or 1%, compared with an idealised un-failed LED having zero series resistance.

In embodiments, each of the relatively high current and the relatively low current is in the range of 1 µA to 100 mA, and the relatively high current is at least 5 times, 100 times or even 1,000 times greater than the relatively low current.

In embodiments, the controller is further configured to, during normal operation, operate the string of LEDs in a pulsed mode between an operating current, which is higher than the relatively high current, and a quiescent current, which is either the relatively low current or zero current. The controller may be yet further configured to, in response to determining that an LED failure has occurred, adjust at least one of the operating current and a mark-space ratio of the pulsed mode to compensate an optical output from the string of LEDs for the LED failure.

According to further aspect there is provided an LED lighting unit comprising a controller as described above, and a series-connected string of LEDs.

According to yet another aspect there is provided an automobile lighting system comprising at least one LED lighting unit as described above, and further comprising a microcontroller, the microcontroller comprising at least the controller as described above and being configured to store LED failure information.

These and other aspects of the invention will be apparent from, and elucidated with reference to, the embodiments described hereinafter.

BRIEF DESCRIPTION OF DRAWINGS

Embodiments of the invention will be described, by way of example only, with reference to the drawings, in which.

Figure 1:
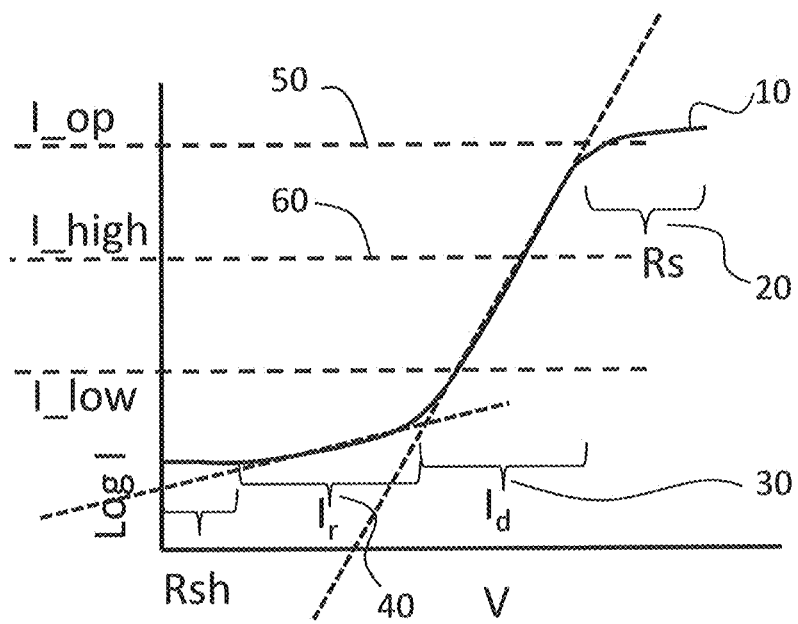
FIG. 1 shows a schematic an I-V characteristic, that is forward voltage versus drive current, of a LED according to the classical two-diode model.

It should be noted that the figures are diagrammatic and not drawn to scale. Relative dimensions and proportions of parts of these figures have been shown exaggerated or reduced in size, for the sake of clarity and convenience in the drawings. The same reference signs are generally used to refer to corresponding or similar feature in modified and different embodiments.

DETAILED DESCRIPTION OF EMBODIMENTS

FIG. 1 shows a schematic of an I-V characteristic of a LED according to the classical two-diode model. According to this model, the DC I-V characteristic, that is to say the variation of forward voltage V with drive current I, of a LED, can be described through a combination of four components: series resistance $R_s$, shunt resistance $R_{sh}$, diffusion current $I_d$, and recombination currents $I_r$, through:

$$I(V) = I_d(V) + I_r(V) - V/R_{sh},$$

or in more detail:

$$I = I_d \cdot e^{q/n_1 kT \cdot (V - IR_s)} + I_r \cdot e^{q/n_2 kT \cdot (V - IR_s)} - (V - IR_s)/R_{sh}.$$

As shown schematically in FIG. 1, the plot 10 of current, on the Y axis or ordinate, against voltage on the X axis or abscissa, has several separate regimes, in which respectively, the series resistance $R_s$, the diffusion current $I_d$, the recombination current $I_r$, component, or the shunt resistance Rsh, dominates. The dotted line in FIG. 1 with the steeper slope represents the exponential function for the diffusion current; the dotted line with the shallower slope represents the exponential function for the recombination current Conventionally, strings of LEDs are driven in constant current mode, corresponding to level 50 as shown. Alternatively, LED strings may be driven by a pulse wave modulated (PWM) signal, in which the current is pulsed between an on-state and an off-state. The overall luminous output of the LEDs is determined by the average current, which may be varied either by varying the on current or the mark-space ratio of the pulses.

The present inventors have proposed an alternative PWM drive regime, wherein instead of the drive current being set to 0, or off, between pulses, it is set to a low but finite "on" value. That is to say, instead of the PWM being between I_op and 0, it is between I_op and I_low. This regime is disclosed, for instance, in international patent application publication number WO2009/095853-A2, as shown schematically on the right-hand half of each of FIG. 2*a* and FIG. 2*b* wherein a time-varying drive current 200 varies with a square wave shape between a first operating high current I_op and a second relatively low current I_low. As shown, the PWM has a mark space ratio of one-to-one since the current has the value I_op 50% of the time; however other mark space ratios are possible with the drive current having a value I_op for a greater or lesser fraction of time. As disclosed in WO2009/095853-A2, this regime allows a determination of the junction temperature of the LED, during operation, by measuring the forward voltage across the LED during the I_low part of the pulsed mode operation.

According to embodiments, and as will be described in more detail hereinbelow, combining the measurement of the forward voltage at I_low, with a measurement at a higher current, I_high, which is still in the current range at which diffusion current dominates, allows for a determination of the ideality factor of the LED, or in the case of a series-connected string of LEDs, an average ideality factor. A failure of an LED in a short circuit mode results in a change in its ideality factor: a short circuit would have a near vertical slope in the I-V curve of FIG. 1, corresponding to an "ideality factor" of almost zero.

So, as will be described in more detail hereinbelow, a change in the average ideality factor of the string may be used to detect such a failure of an LED.

Figure 3:
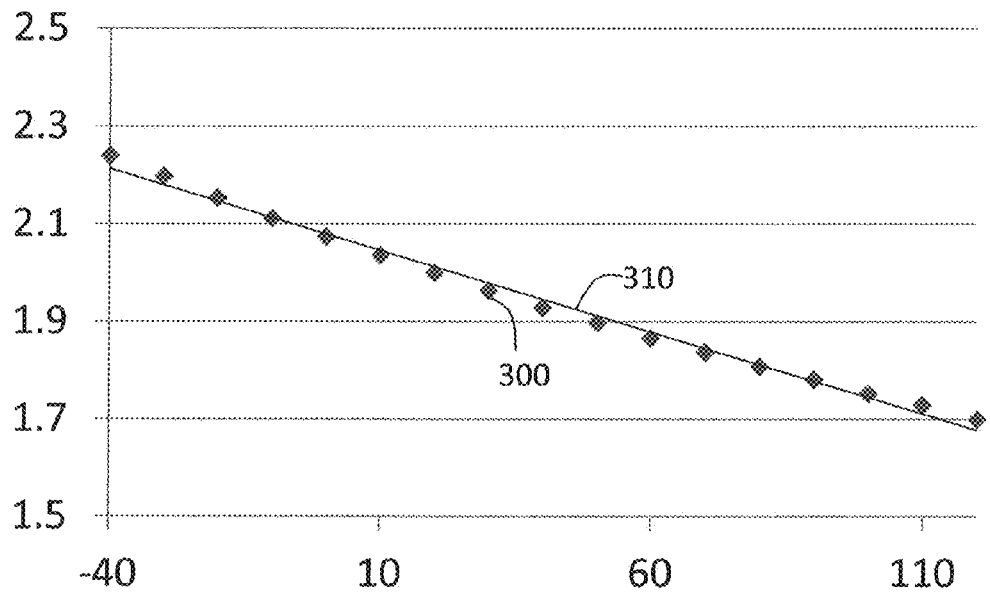
FIG. 3 shows a plot of measured forward voltage, at a fixed current, against temperature for a LED.

FIG. 3 shows a plot 300 of measured forward voltage, in volts, at a fixed current, against temperature for a LED in ° C. The LED is driven at a drive current of 10 µA. The figure shows that the forward voltage falls from over 2.2 V to less than 1.7 V, across a temperature range of −40° C. to 110° C. The figure further includes a linear best fit curve 310 to the measured data, from which it is clear that the measurements may be approximated, over this temperature range, by a linear function. From FIG. 3 it may readily be seen that, at this drive current, for each increase in temperature by approximately 30°, the forward voltage drops by approximately 5%.

Figure 4:
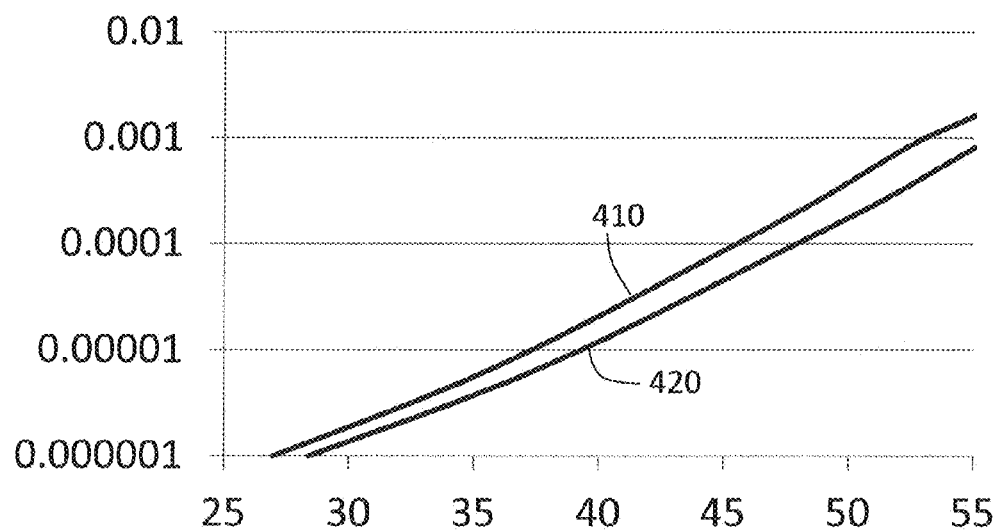
FIG. 4 shows a plot of measured forward voltage versus drive current for a string of 19 LEDs and a string of 20 LEDs.

FIG. 4 shows a plot of measured forward voltage, on the X axis or abscissa, versus the drive current, on the Y axis or ordinate, for a string of 19 LEDs (shown at 410) and a string of 20 LEDs (shown at 420), measured at the same temperature. Relative to the 19-LED string forward voltage, the forward voltage across the 20-LED string is scaled, that is to say stretched to the right, by a factor of 20/19, that is to say by 5%. If one LED in a string of 20 LEDs was thus to fail suddenly in a short-circuit mode, the resulting I-V characteristic would shift to the left, from line 422 to 410, as shown. For a fixed drive current, there would thus be a voltage drop corresponding to 5% of the voltage.

It should be noted that this is the same voltage drop that would be observed by an increase in temperature of approximately 30°. So it is not possible to know, a priori, whether the change in voltage is due to the sudden short-circuit of a LED, or due to a sudden temperature change by 30°.

The change would be sudden—of the order of a few 10 s of ms. However, in normal operation a sudden temperature change of 30° would not be expected to be encountered, since it typically takes a few minutes to effect a temperature change of 30°. So, in normal operation it may be possible to conclude, were a forward voltage drop of 5% to be observed, that an LED has failed.

It will be noted that this is likely not to be the case during start up, when the temperature is not well-defined. For instance, consider a typical use case—that of lighting for automobile applications, such as cars. Even if the temperature of the lighting module is known when the car ignition is switched on, the lighting may be used intermittently—for instance driving in and out of tunnels. In that case, the lighting may be switched off, and then switched back on before having chance to cool significantly; when the lighting is switched back on, the LED temperature will then not be the ambient temperature, but may differ from ambient by up to 60° or more. So, an equivalent temperature change of 30° cannot be relied on to detect a failure at start-up.

Figure 5:
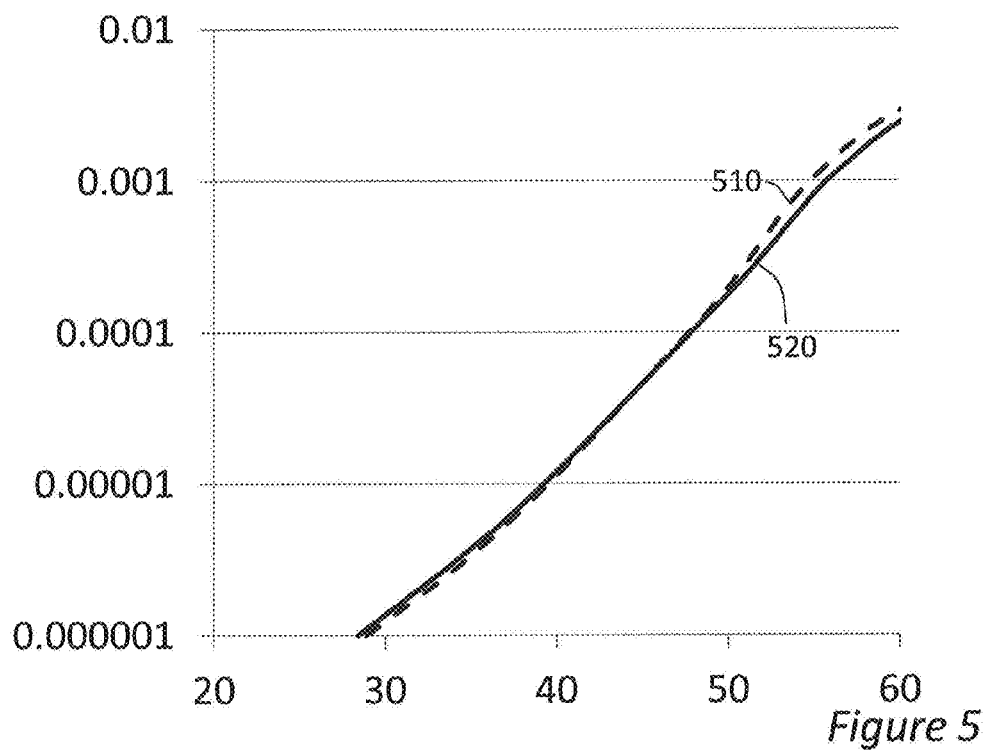
FIG. 5 shows a plot of measured forward voltage versus drive current for a string of 19 LEDs at 10° C. and a string of 20 LEDs at 20° C.

FIG. 5 shows a plot of measured forward voltage in V on the X axis or abscissa, versus the drive current in Amps, on the Y axis or ordinate, for a string of 19 LEDs at −10° C. (shown dotted at 510) and a string of 20 LEDs at 20° C., (shown solid at 520). The string of 19 LEDs is equivalent to a string of 20 LEDs in which one of the LEDs has suffered a short circuit failure with a negligible series resistance. The figure demonstrates that, although the plots have very similar values at a drive current of 10 µA, the shape of the curve is somewhat different. In order to understand this, two separate factors should be considered: first of all, at operational currents (as shown of the order of 100 mA to several A and above), series resistance $R_s$ plays a significant factor, and the series resistance of a string of 19 LEDs may be expected to be different from that of a string of 20 LEDs. Secondly, and of more significance as far as the present disclosure is concerned, over the voltage range where the diffusion (ie radiative) current dominates, the shorted LED may be considered to have a near-zero ideality factor (attempting to fit an exponential to the short would require a near-zero value of $n_1$): the 'average' of the ideality factors of 20 LEDs each which have an ideality factor $n_1$ is different to the average of the ideality factors of 20 LEDs wherein only 19 LEDs have an ideality factor of $n_1$ and the 20th has an ideality factor 0; thus it may be expected that the shape of the plots are different over this voltage regime.

Figure 6:
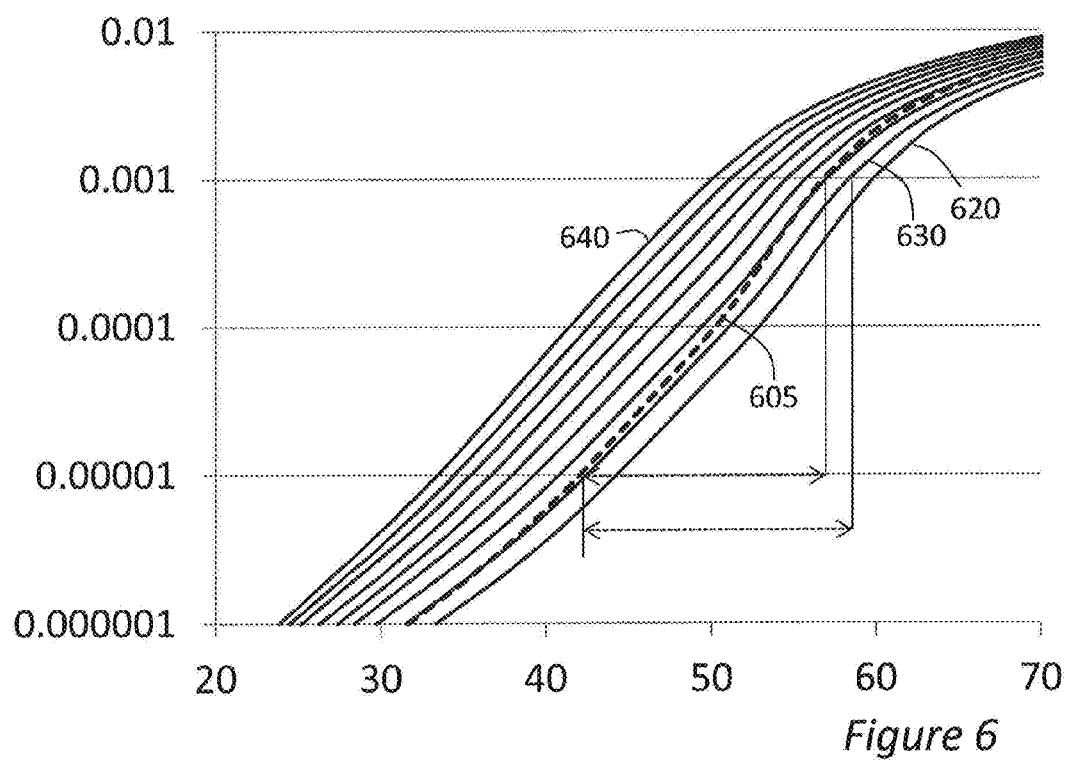
FIG. 6 overlays a plot of measured forward voltage versus drive current for the string of 19 LEDs at −40° C. onto plots of the forward voltage versus drive currents of a string of 20 LEDs at temperatures ranging from minus 40° C. to (plus) 120° C.

FIG. 6 overlays a plot of measured forward voltage versus drive current for the string of 19 LEDs at −40° C., shown at 605, onto plots of the forward voltage versus drive currents of a string of 20 LEDs at temperatures ranging from −40° C. to 120° C. (shown at 620, 630 . . . 640). The difference in shape of the plots, explained in more detail with reference to FIG. 5, is particularly apparent in this figure.

The inventors have made the surprising realisation that this difference in shape may be exploited so as to provide another way of detecting a failure of an LED, as will be explained in more detail hereinunder.

Figure 7:
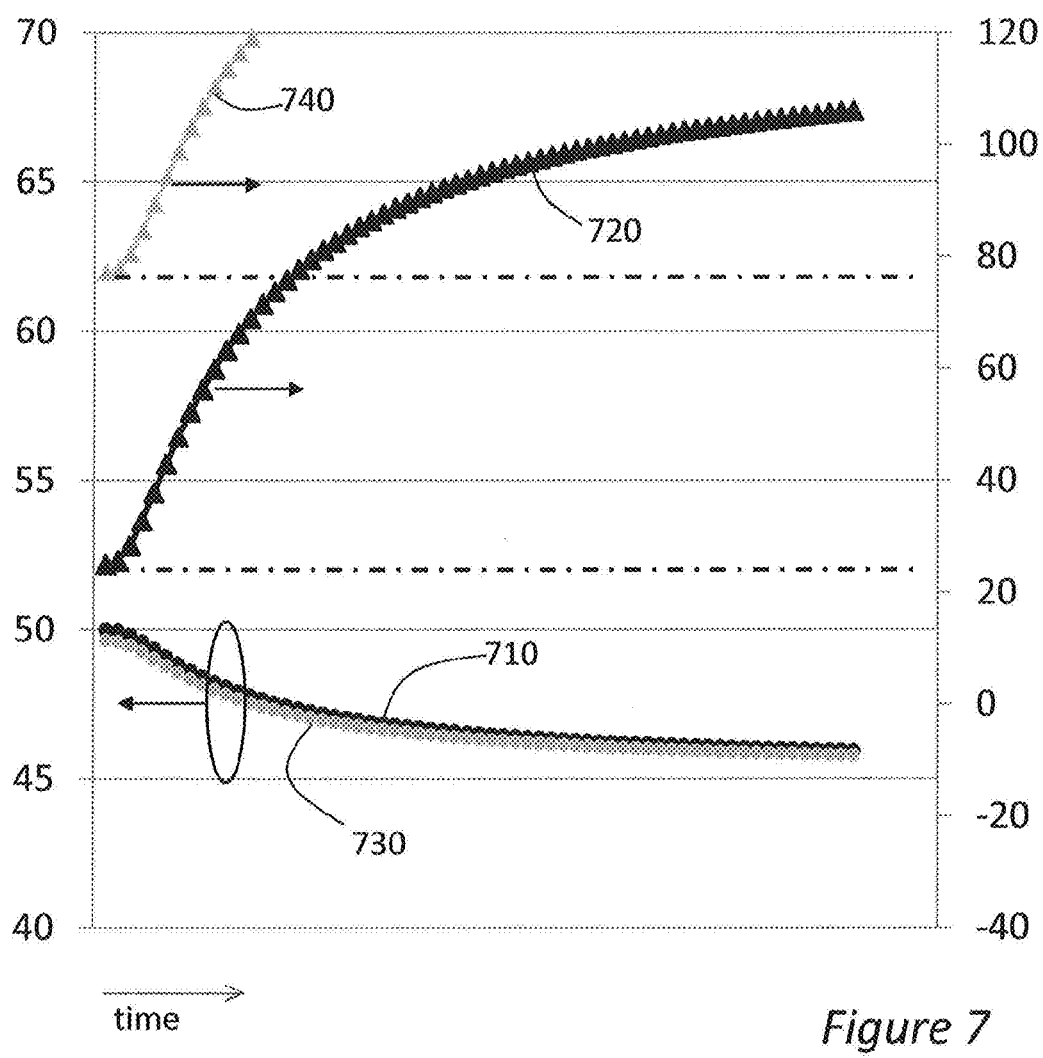
FIG. 7 shows a plot of measured voltage-delta against junction temperature for strings of 19 and 20 LEDs.

Referring now to FIG. 7, this figure shows at 710 the forward voltage (using the scale on the left-hand-axis), measured at 10 µA, for a string of 20 LED's, measured against time, after the string is switched on. The forward voltage gradually falls, corresponding to an increase in junction temperature of the LED's. Using the method disclosed in WO2009/095853-A2, the calculated junction temperature of the LEDs is also shown at 720 (using the scale on the right hand-axis). It can be seen that the LEDs rapidly warm up past 100° C., On the same figure is shown, at 730, the calculated temperatures for a string of 19 LEDs, which is equivalent to a string of 20 LEDs one of which has failed in a short-circuit mode. For comparison, the same voltage are used as for the 20-LED string. For the purposes of presentation only, the curves have been displaced slightly. The equivalent calculated temperatures of the 19-LED string are shown at 740.

It can be seen the forward voltage indicating a junction temperature of 25° C. —for the string of 20 LEDs—which is the initial state, corresponds to a junction temperature of nearly 80° C. for the string of 19 LEDs. So, if the forward voltage of 50V is measured, it is not possible to determine, without further information, whether there is a "good" string of 20 LEDs, operating at a junction temperature of 25° C., or whether there is a "bad" string of 20 LEDs one of which has failed in a short-circuit mode, operating at nearly 80° C.

Of course, it will be appreciated that in some senses, the situation of FIG. 7 represents a "worst case" scenario. In particular, the LED string may be less than 20 LEDs. Typically, 10 or even 5, LEDs may be in a string, which would result in a larger relative equivalent temperature difference. Also, if the voltage is low—say about 47V, then the temperature for the 20 LED string would be about 90° C., but the equivalent calculated temperature for a 19-LED string would be unrealistically higher—at about 180° C.

In accordance with embodiments, the forward voltage $V(I\_high)$ at a first, relatively high current ($I\_high$), is measured, as is the forward voltage $V(I\_low)$ at a relatively low current ($I\_low$). A voltage-delta $\Delta V_f$ may then be defined as the difference between the forward voltage for the high current, and the forward voltage for the low current, that is to say:

$$\Delta V_f = V(I\_high) - V(I\_low).$$

Each of the relatively high current and the relatively low current is in the range of 1 μA to 100 mA, and the relatively high current may be at least 5 times greater than the relatively low current. In other embodiments different drive currents may be used for either I_high, I_low, or both. Differences may be, without specific limitation, factors of 10, 100 or even 1,000. In a particular, non limiting embodiment, the current levels may be set to be I_high=1 mA, and I_low=10 μA. In this case there is a factor of 100 difference between the high and low current levels. However it should be noted that it has been found that the I_low current should not be so low that the LED (at the low current) is operating in the voltage regime in which recombination current is dominant. This is because the voltage-delta may be considered as a 'proxy' or an indication of the ideality factor, and thus it may be important that the same diode (with either ideality factor $n_1$ or $n_2$) of the two diodes in the two-diode model is dominant.

Although as described so far, and below, a voltage-delta has been considered, it will be appreciated that other measurements which are indicative of the voltage difference may be used instead. In particular, other measurements of the slope of the curve, which provides an indication of the ideality factor, may be used. These will be immediately apparent to the skilled person, and include, for instance, integration of the current whilst the voltage is increased.

Figure 8:
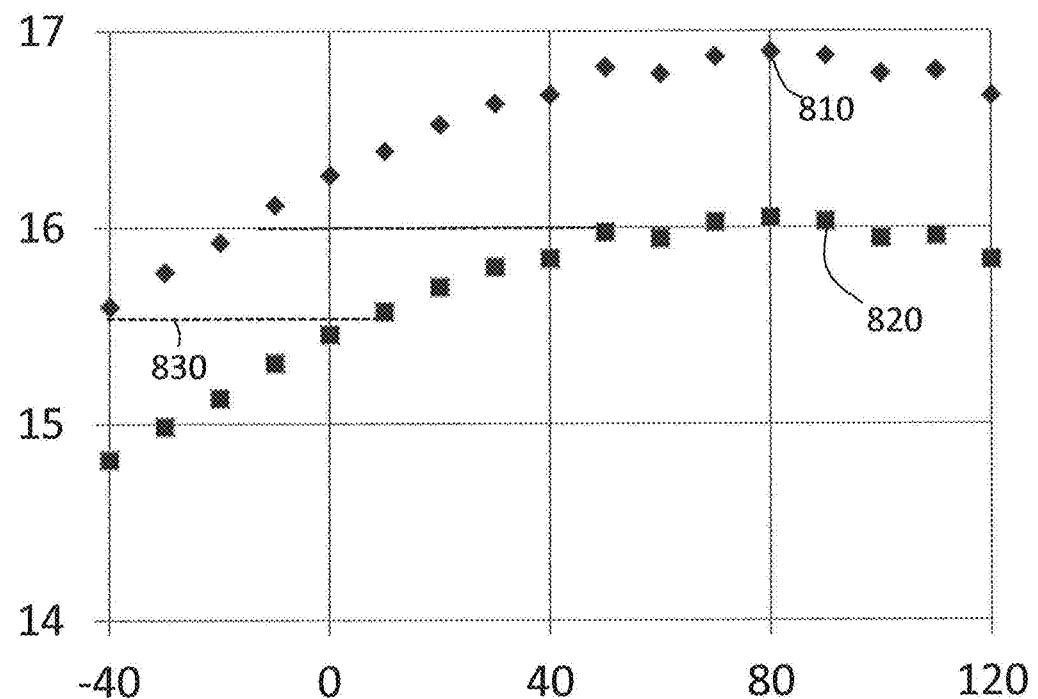
FIG. 8 shows a plot of measured voltage-delta against junction temperature for strings of 19 and 20 LEDs.

FIG. 8 shows a plot of measured voltage-delta against junction temperature for strings of 19 and 20 LEDs. The string of 20 operational LEDs is shown at plot 810, and a string of 19 LEDs, corresponding to a string in which one of the LEDs has failed in a short-circuit mode, is shown at plot 820. In this example, the measurements were made with a high drive current, I_high, of 1 mA, and a low drive current, I_low, of 10 μA. Then $$\Delta V_f = V(1\text{ mA}) - V(10\text{ μA}).$$

As can be seen from the figure, the 20-LED string has a voltage-delta of approximately 15.6 V at −40° C. It will be noticed that the 19-LED string also exhibits this voltage-delta, but in this case at a temperature of approximately 10° C. That is to say, there is a temperature difference, shown at 830, of approximately 50° between the co-incidences of voltage-delta. Similarly, the 20-LED string has a voltage D of 16 V at approximately −15° C., whereas the 19-LEDs string has that voltage delta only at around +50° C. So, once again, there is a large temperature difference, in this case approximately 65°, between the coincidences of the voltage-delta. Finally, it is noted that for some values of the voltage-delta for the 20-LED string, there is no temperature at which the same voltage-delta exists for the 19-LED string.

So, use of the voltage-delta provides a generally more reliable method of detecting a short-circuit LED failure, than a single voltage measurement.

Figure 9:
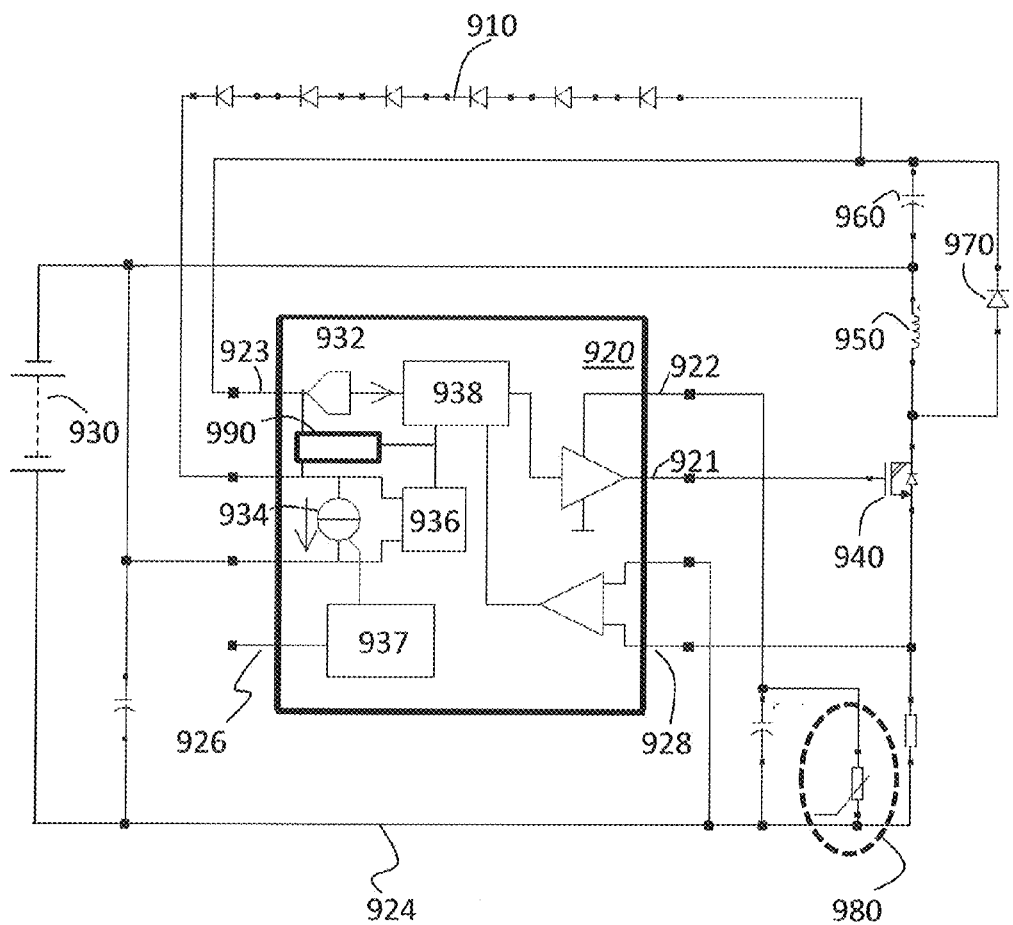
FIG. 9 shows a block diagram of a circuit comprising a controller according to embodiments.

FIG. 9 shows a block diagram of a circuit comprising a controller according to embodiments. The circuit comprises a string of LEDs 910, to which power is supplied under the control of a controller 920. The power is supplied from a battery 930. The controller 920 controls, through a driver signal on pin 921 which drives the control terminal of a switch 940 which forms part of a buck/boost converter operating in peak-current control mode and comprising inductor 950, capacitor 960 and diode 970, in order to provide a relatively stable, or constant current through the LED string 910. In embodiments, the PWM signal for the buck/boost converter may be generated by the controller 920, or supplied from an external supply, shown on pin 926. The voltage at the switch is sensed on pin 928. The controller provides digital control of the output voltage, on pin 923, via an analog-to-digital converter (ADC) 932, current source 934, integrator 936, counter 937 and internal PWM generator 938.

Conventionally, the circuit would include a temperature sensor 980 connected between the Vcdc supply voltage and ground 924, and which may be used to provide an indication of any failures in the LED string. However, according to embodiments, the controller 922 may be configured to provide this indication without the need for a temperature sensor. The temperature sensor may thus be redundant. According to embodiments, the controller is configured to further enable the constant current source to drive the LED string with the relatively low current and the relatively high current, by control circuit 990. The control circuit 990 may be termed as a sensor-less sensor, since it provides a similar function to that provided by the temperature sensor 980.

Figure 10:
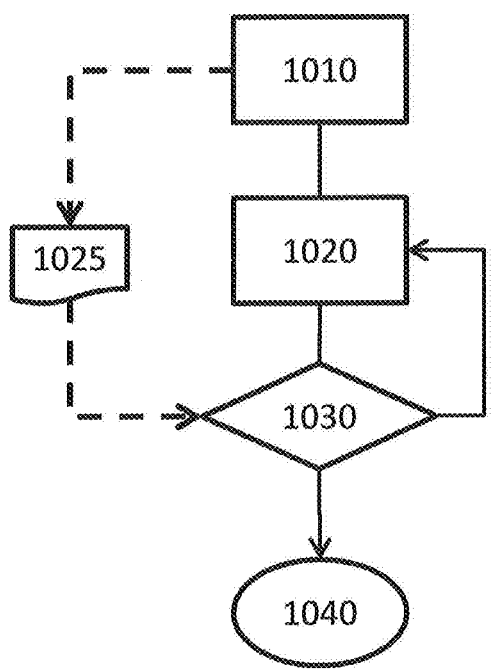
FIG. 10 shows a flow chart of a method according to embodiments.

FIG. 10 shows a flow chart 1000 of a method according to embodiments. In an initial calibration stage 1010, the voltage-delta is measured, and the calibration value stored at 1020. The initial calibration may be carried out, for instance, when the string of LEDs is first operated in conjunction with the controller. The value of the voltage-delta recorded is expected to be dependent on the type of LEDs used. Subsequently, when the LED lighting comprising the string of LEDs is switched on, one or more measurements of the voltage delta is made, at step 1020. Although it may be adequate to make a single measurement of the forward voltage at the relatively high current, and a single measurement of the forward voltage at the relatively low current, it may be preferred to make multiple measurements of one or both of these values. In particular the voltage at the relatively low current may be liable to measurement errors or measurement inaccuracies, and it may be possible to reduce the random element of such measurement errors by making multiple measurements, either during a single pulse, or during multiple pulses.

This subsequent measurement of the voltage-delta is then compared, at step 1030, with the stored calibration value. If the calibration value exceeds the subsequent value of the voltage delta by more than some predetermined threshold value, it may be determined that an LED has failed in short-circuit mode. In the embodiment shown this is shown at 1040 in an indicator. The indicator may take one or more of several forms which will be immediately apparent to the skilled person. For instance indication may be provided as a high value on a signal data line from the controller to some other controller; alternatively the indicator may be provided as an input to the controller itself which may make adjustments to compensate for the failure, or may report back to some global controller that a failure has occurred. Notification may be provided to an operator to indicate that a replacement of the string of LEDs may be required.

Figure 2A:
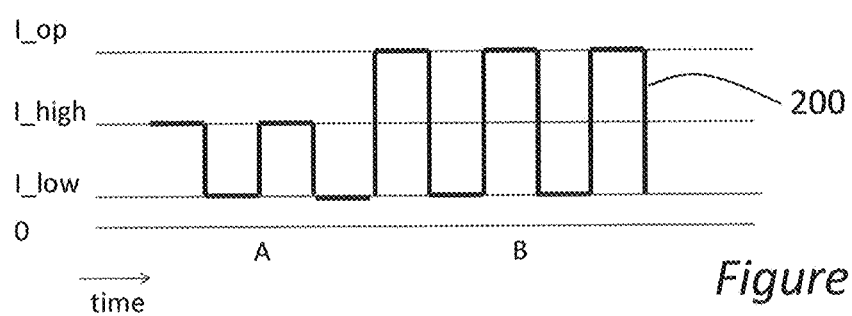
FIGS. 2a and 2b show two PWM drive signals for an LED string, alternating between a high and a low current, with start-up currents according to embodiments.
Figure 2B:
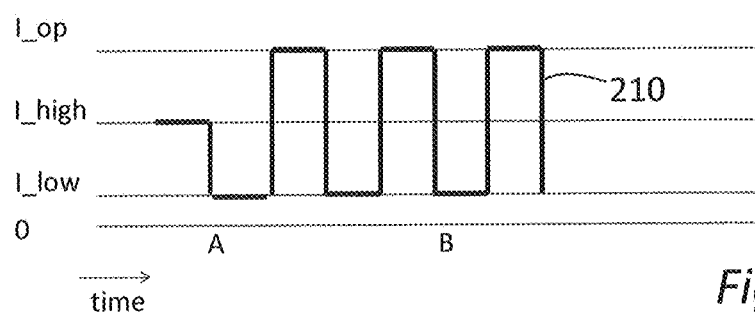

As shown in FIG. 2 and mentioned above, a single pair of measurements may be made, or more than one measurement of voltage may be made at either or both of the relatively high voltage and the relatively low voltage. This is illustrated towards the left hand side of FIG. 2b and FIG. 2a respectively. After completion of the measurements, the controller may continue to drive the string of LEDs with a PWM signal as shown in FIG. 2a and FIG. 2b, with a relatively low current instead of a zero current during the nominally "off" part of the pulse wave modulation, or may drive the LEDs with a conventional on-off PWM signal, or may drive the LEDs with a stable, constant, or nearly constant current, as illustrated with reference to FIG. 9.

From reading the present disclosure, other variations and modifications will be apparent to the skilled person. Such variations and modifications may involve equivalent and other features which are already known in the art of LED controllers, and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub-combination.

The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfil the functions of several means recited in the claims and reference signs in the claims shall not be construed as limiting the scope of the claims.

The invention claimed is:

1. A method of detecting an LED failure in a series-connected string of LEDs using a parameter indicative of a voltage difference between a voltage across the string at a predetermined relatively high current and a voltage across the string at a predetermined relatively low current, wherein at both the relatively low current and the relatively high current levels the current through an un-failed LED is dominated by minority-carrier diffusion current, the method comprising:
   determining a calibration value of the parameter during a first start-up phase;
   storing the calibration value;
   determining a subsequent value of the parameter during a subsequent measurement phase; and,
   in response to a difference between the calibration value and the subsequent value exceeding a threshold, determining that an LED failure has occurred.

2. The method of claim 1, wherein the relatively high current is such that the effect of a series resistance of an un-failed LED operating at the relatively high current is to reduce the current by no more that 1%, compared with an idealised un-failed LED having zero series resistance.

3. The method of claim 1, wherein each of the relatively high current and the relatively low current is in the range of 1 μA to 100 mA, and the relatively high current is at least 5 times greater than the relatively low current.

4. The method of claim 1 wherein the calibration value is determined when the string of LEDs is first operated in an application.

5. The method of claim 1, wherein, during normal operation, the string of LEDs is operated in a pulsed mode between an operating current, which is higher than the relatively high current, and a quiescent current, which is either the relatively low current or zero current.

6. The method of claim 5, further comprising, in response to determining that an LED failure has occurred, adjusting at least one of the operating current and a mark-space ratio of the pulsed mode to compensate an optical output from the string of LEDs for the LED failure.

7. A controller configured to detect an LED failure in a series-connected string of LEDs using a parameter indicative of a voltage difference between a voltage across the string at a predetermined relatively high current and a voltage across the string at a predetermined relatively low current, wherein at both the relatively low current and the relatively high current levels the current through an un-failed LED is dominated by minority-carrier diffusion current
   the controller comprising:
   a measuring unit configured to determine a calibration value of the parameter during a first start-up phase, and to determine a subsequent value of the parameter during a subsequent measurement phase;
   a storage means configured to store the calibration value; and a comparison unit configured to indicate an LED failure in response to a difference between the calibration value and the subsequent value exceeding a predetermined threshold.

8. A controller according to claim 7, wherein the high current is such that the effect of a series resistance of an un-failed LED operating at the high current is to reduce the current by no more that 1%, compared with an idealised un-failed LED having zero series resistance.

9. A controller according to claim 7, wherein each of the relatively high current and the relatively low current is in the range of 1 μA to 100 mA, and the relatively high current is at least 5 times greater than the relatively low current.

10. A controller according to claim 7, further configured to, during normal operation, operate the string of LEDs in a pulsed mode between an operating current, which is higher than the relatively high current, and a quiescent current, which is either the relatively low current or zero current.

11. A controller according to claim 10, further configured to, in response to determining that an LED failure has occurred, adjust at least one of the operating current and a mark-space ratio of the pulsed mode to compensate an optical output from the string of LEDs for the LED failure.

12. An LED lighting unit comprising a controller as claimed in claim 7, and a series-connected string of LEDs.

13. An automobile lighting system comprising at least one LED lighting unit as claimed in claim 12, and further comprising a microcontroller, the microcontroller comprising at least the controller as claimed in claim 12 and being configured to store LED failure information.

* * * * *